United States Patent
Shivkumar et al.

(10) Patent No.: US 6,949,822 B2
(45) Date of Patent: Sep. 27, 2005

(54) SEMICONDUCTOR MULTICHIP MODULE PACKAGE WITH IMPROVED THERMAL PERFORMANCE; REDUCED SIZE AND IMPROVED MOISTURE RESISTANCE

(75) Inventors: Bharat Shivkumar, Redondo Beach, CA (US); Chuan Cheah, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 445 days.

(21) Appl. No.: 09/812,027

(22) Filed: Mar. 19, 2001

(65) Prior Publication Data

US 2001/0050441 A1 Dec. 13, 2001

Related U.S. Application Data
(60) Provisional application No. 60/190,143, filed on Mar. 17, 2000.

(51) Int. Cl.[7] .................. H01L 23/495; H01L 23/48; H01L 23/10; H01L 29/40
(52) U.S. Cl. .................. 257/704; 257/666; 257/667; 257/688; 257/707; 257/777; 257/778
(58) Field of Search ................ 257/666, 777, 257/778, 667, 688, 707, 723, 700, 722, 924, 734, 746, 706, 709; 361/728

(56) References Cited

U.S. PATENT DOCUMENTS

| | | | | |
|---|---|---|---|---|
| 5,061,686 A | * | 10/1991 | Ruby ..................... | 505/192 |
| 5,302,852 A | * | 4/1994 | Kaneda et al. ........... | 257/704 |
| 5,311,402 A | * | 5/1994 | Kobayashi et al. ...... | 174/17.05 |
| 5,336,456 A | * | 8/1994 | Eskildsen et al. ........ | 264/157 |
| 5,795,799 A | * | 8/1998 | Hosoya ................. | 438/126 |
| 5,866,952 A | * | 2/1999 | Wojnarowski ........... | 257/788 |
| 5,907,477 A | * | 5/1999 | Tuttle et al. ............ | 361/760 |
| 5,956,576 A | * | 9/1999 | Toy et al. .............. | 438/125 |
| 6,054,759 A | * | 4/2000 | Nakamura .............. | 257/691 |
| 6,071,755 A | * | 6/2000 | Baba et al. ............. | 438/106 |
| 6,127,724 A | * | 10/2000 | DiStefano .............. | 257/675 |
| 6,157,080 A | * | 12/2000 | Tamaki et al. .......... | 257/738 |
| 6,201,301 B1 | * | 3/2001 | Hoang .................. | 257/712 |
| 6,268,654 B1 | * | 7/2001 | Glenn et al. ........... | 257/704 |
| 6,354,485 B1 | * | 3/2002 | Distefano .............. | 228/179.1 |

(Continued)

FOREIGN PATENT DOCUMENTS

| | | | |
|---|---|---|---|
| EP | 0578411 | * | 12/1994 |
| JP | 356012756 | * | 2/1981 |
| JP | 35821813 | * | 12/1983 |
| JP | 404092457 | * | 3/1992 |
| JP | 05267558 | * | 10/1993 |
| JP | 406112401 | * | 4/1994 |
| JP | 410335544 | * | 12/1998 |
| JP | 2001210778 | * | 8/2001 |

*Primary Examiner*—Carl Whitehead, Jr.
*Assistant Examiner*—James Mitchell
(74) *Attorney, Agent, or Firm*—Ostrolenk, Faber, Gerb & Soffen, LLP

(57) ABSTRACT

A multichip module has a substrate, which receives several flip chip and for other semiconductor die on one surface and has vias extending through the substrate from the flip chip bottom electrodes to solder ball electrodes on the bottom of the substrate. Passive components are also mounted on the top of the substrate and are connected to further vias which extend to respective ball contacts at the substrate bottom. In one embodiment, the bottom surfaces and electrodes of the die are insulated and their tops (and drain electrodes) are connected by a moldable conductive layer. In another embodiment the top surface of the substrate is covered by an insulation cap, which may be finned for improved thermal properties. The passives are upended to have their longest dimension perpendicular to the substrate surface and are between the fin valleys. The insulation cover is a cap which fits over the top of the substrate, with mold lock depressions contained in the junction between the cap peripheral interior edge and the substrate mating edge surfaces.

2 Claims, 4 Drawing Sheets

U.S. PATENT DOCUMENTS

| | | | |
|---|---|---|---|
| 6,369,448 B1 * | 4/2002 | McCormick | 257/777 |
| 6,392,294 B1 * | 5/2002 | Yamaguchi | 257/690 |
| 6,586,677 B2 * | 7/2003 | Glenn | 174/52.2 |
| 6,602,740 B1 * | 8/2003 | Mitchell | 438/127 |
| 6,724,214 B2 * | 4/2004 | Manna et al. | 324/766 |
| 6,774,466 B1 * | 8/2004 | Kajiwara et al. | 257/673 |
| 6,777,794 B2 * | 8/2004 | Nakajima | 257/686 |
| 2001/0015492 A1 * | 8/2001 | Akram et al. | 257/706 |

* cited by examiner

SEMICONDUCTOR MULTICHIP MODULE PACKAGE WITH IMPROVED THERMAL PERFORMANCE; REDUCED SIZE AND IMPROVED MOISTURE RESISTANCE

RELATED APPLICATIONS

This application is related to and claims priority to Provisional Application Ser. No. 60/190,143 filed Mar. 17, 2000.

FIELD OF THE INVENTION

This invention relates to semiconductor devices and more specifically relates to novel semiconductor device package structures and packaging methods for multichip modules.

BACKGROUND OF THE INVENTION

Multichip semiconductor modules ("MCMs") are known and generally consist of a plurality of interconnected semiconductor die mounted on a substrate to form small power conditioning circuits such as d-c to d-c converters, power supplies for portable electronic equipment and the like.

It is very desirable in such devices to minimize electrical resistance due to packaging (die free package resistance or DFPR); to maximize chip foot print ratios; to improve the thermal resistance $R_{th}$ of the package; and to improve package reliability and manufacturability.

BRIEF SUMMARY OF THE INVENTION

In accordance with the invention; a number of novel package innovations, which can be used separately or in combination are provided.

Thus, a "liquid metal" mold cap (a conductive metal-filled epoxy, for example) is provided with vertical insulation barriers separating the top contacts of selected chips while still improving DFPR. The conductive, or liquid metal electrode may be cast with fins to improve cooling.

The chip-foot print ratio is maximized by "tomb-stoning" (or erecting vertically) elongated passive components and by stacking die atop one another.

Thermal resistance is improved by forming fin structures in the top conductive contact, or in an insulation mold cap. Tall passives on the substrate are preferably moved to the center of the substrate and between finned areas.

Reliability and manufacturability is substantially improved by using mold locks to lock the insulation cap onto and telescoping over an organic substrate which receives semiconductor die.

DETAILED DESCRIPTION OF THE DRAWINGS

Figure 1:
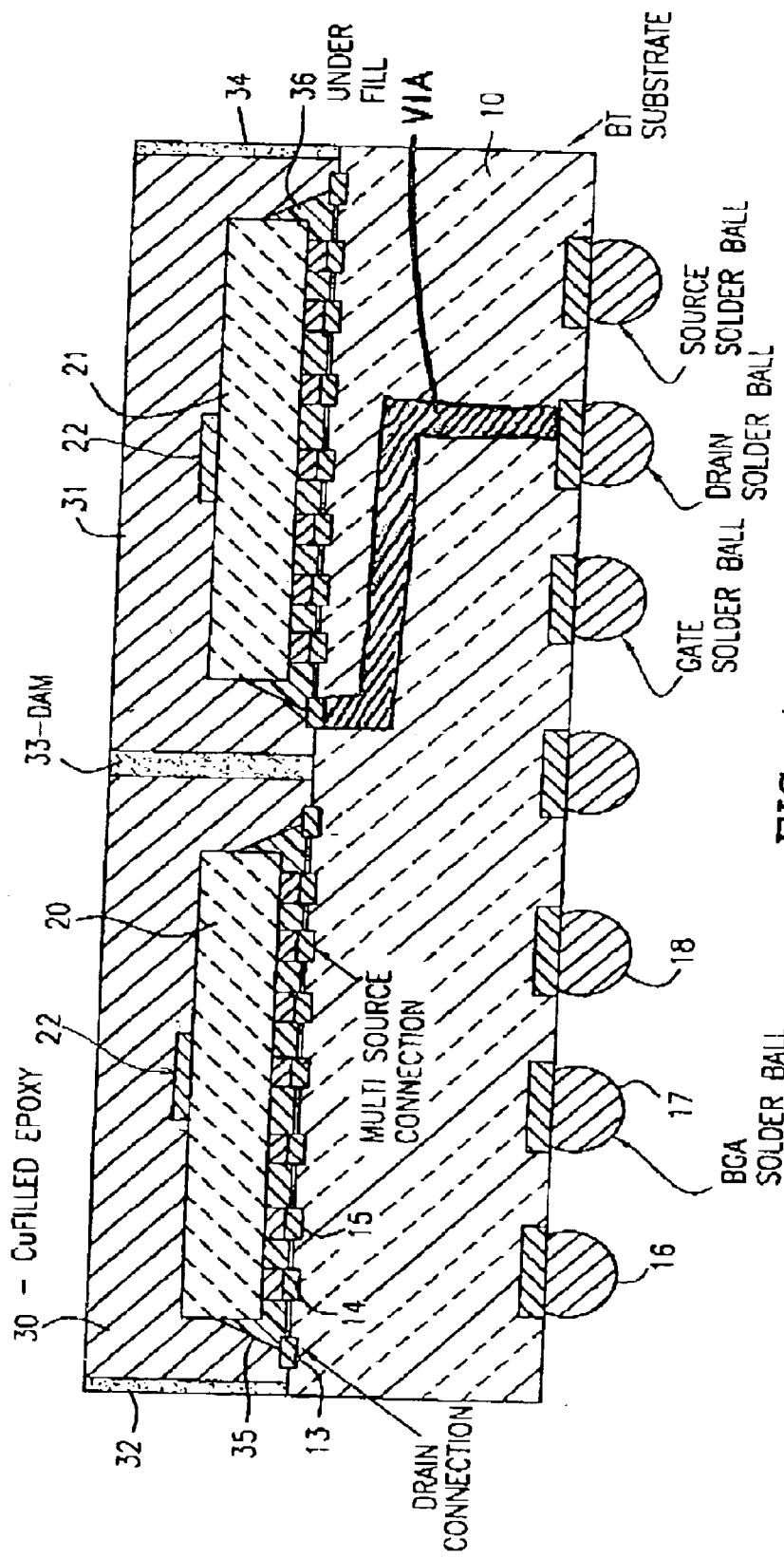
FIG. 1 is a cross-section of an MCM package with insulated liquid metal top contacts segments for minimized DFPR.

Referring first to FIG. 1, there is shown an MCM package comprised of an organic or other substrate 10 which contains suitable conductive vias (not shown) connecting conductive electrodes such as electrodes 13, 14, 15 on the top of substrate 10 to respective BGA solder balls on the bottom of the substrate, such as BGA solder balls 16, 17 and 18. Two semiconductor die 20 and 21 are mounted on the substrate 10 and may be flip-chip power MOSFET die having their source contacts and gate contacts on the bottom of the die and in contact, through suitable vias, with appropriate ones of the solder balls 16, 17 and 18. The tops of die 20 and 21 are immersed in "liquid metal" (e.g. copper or silver powder filled epoxy) top contacts 30 and 31 which are conductive and electrically insulated from one another by insulation darns 32, 33, 34. The bottoms of chips 20 and 21 are further insulated by insulation underfill 35 and 36. The top contacts 30 and 31 are connected to the drain electrodes 22 of die 20 and 21 (which are vertical conduction devices) respectively and are connected to suitable contacts 13 (DRAIN CONNECTION) on the top of substrate 10 and then to suitable bottom solder balls 16, 17, 18.

While die 20 and 21 are shown as vertical conduction MOSFETs, they can be any other die, for example, IGBTs; thyristors; diodes and the like, having power electrodes on opposite respective surfaces of the die.

The structure described above for FIG. 1 may also use copperstrap conductors of the kind shown in U.S. Pat. No. 6,040,626 to decrease top metal resistance and eliminate wire resistance. Further, the novel structure reduces DFPR. The liquid metal contacts may be cast with fins in their top surface if desired.

Figure 2:
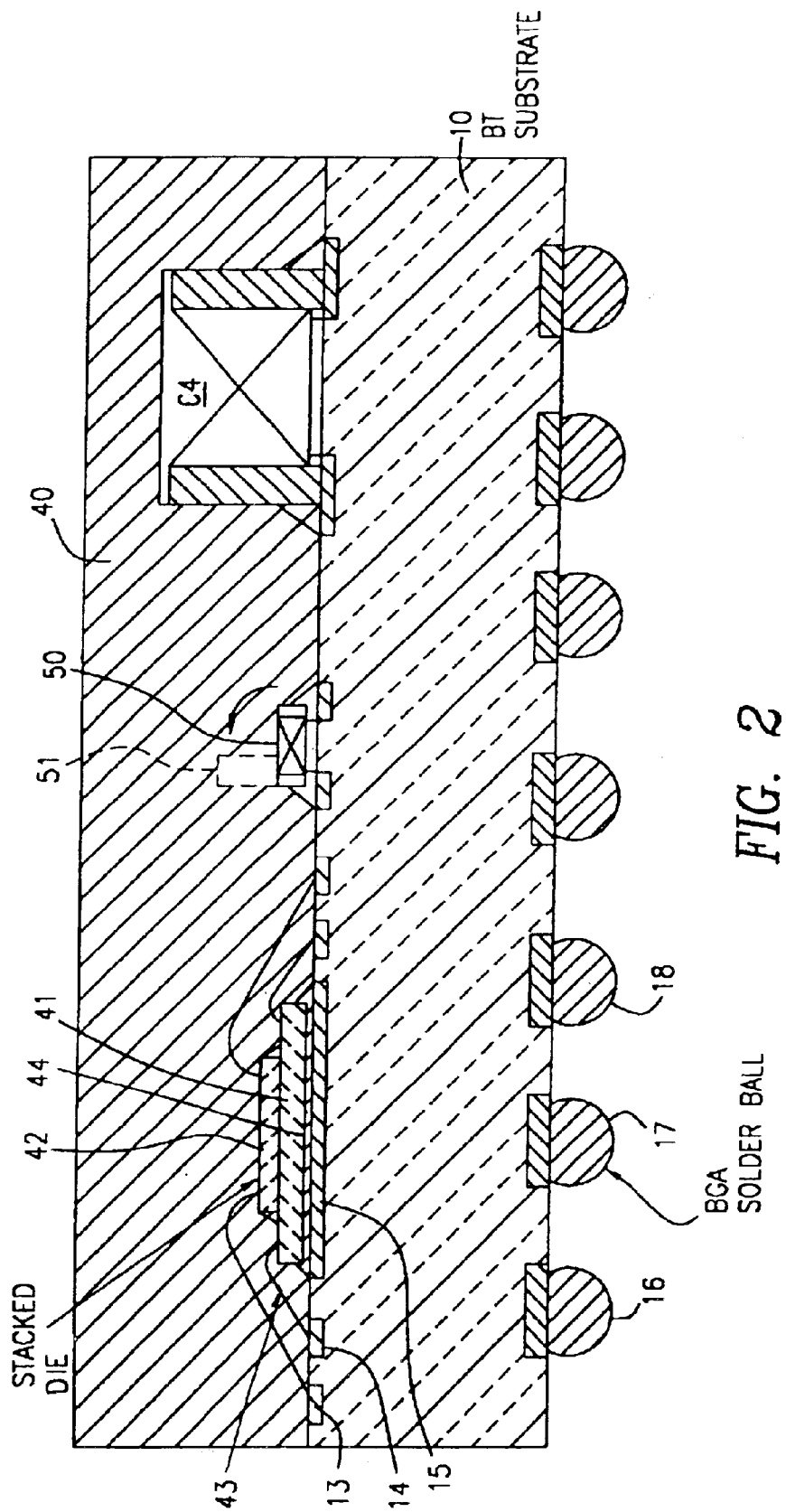
FIG. 2 is a cross-section of an MCM package in which passive components are tomb-stoned to minimize chip-foot print ratios.

FIG. 2 shows a second embodiment of the invention. In FIG. 2, as well as FIGS. 3 and 4, reference numerals describing similar elements have similar identifying numerals. FIG. 2 first shows an insulation mold cap 40 which encloses the top of substrate 10 and all components mounted on the surface. Thus, in FIG. 2, two semiconductor die 41 and 42 are shown stacked atop one another and soldered or conductively cemented to a conductive trace 15 on substrate 10 and wire bonded to appropriate via terminals on substrate 10. Devices 41 and 42 may be diverse devices, for example, a MOSFET and a diode (or an integrated circuit chip if desired). Two passive components, a capacitor C4 and resistor 50 are also fixed to via terminals 53 and 54 respectively on substrate 10. Note that resistor 50 can be erected in tomb-stone fashion (with its longest dimension perpendicular to the mounting surface) as shown by dotted line 51 to reduce the area (or "foot print") needed for the substrate 10.

Figure 3:
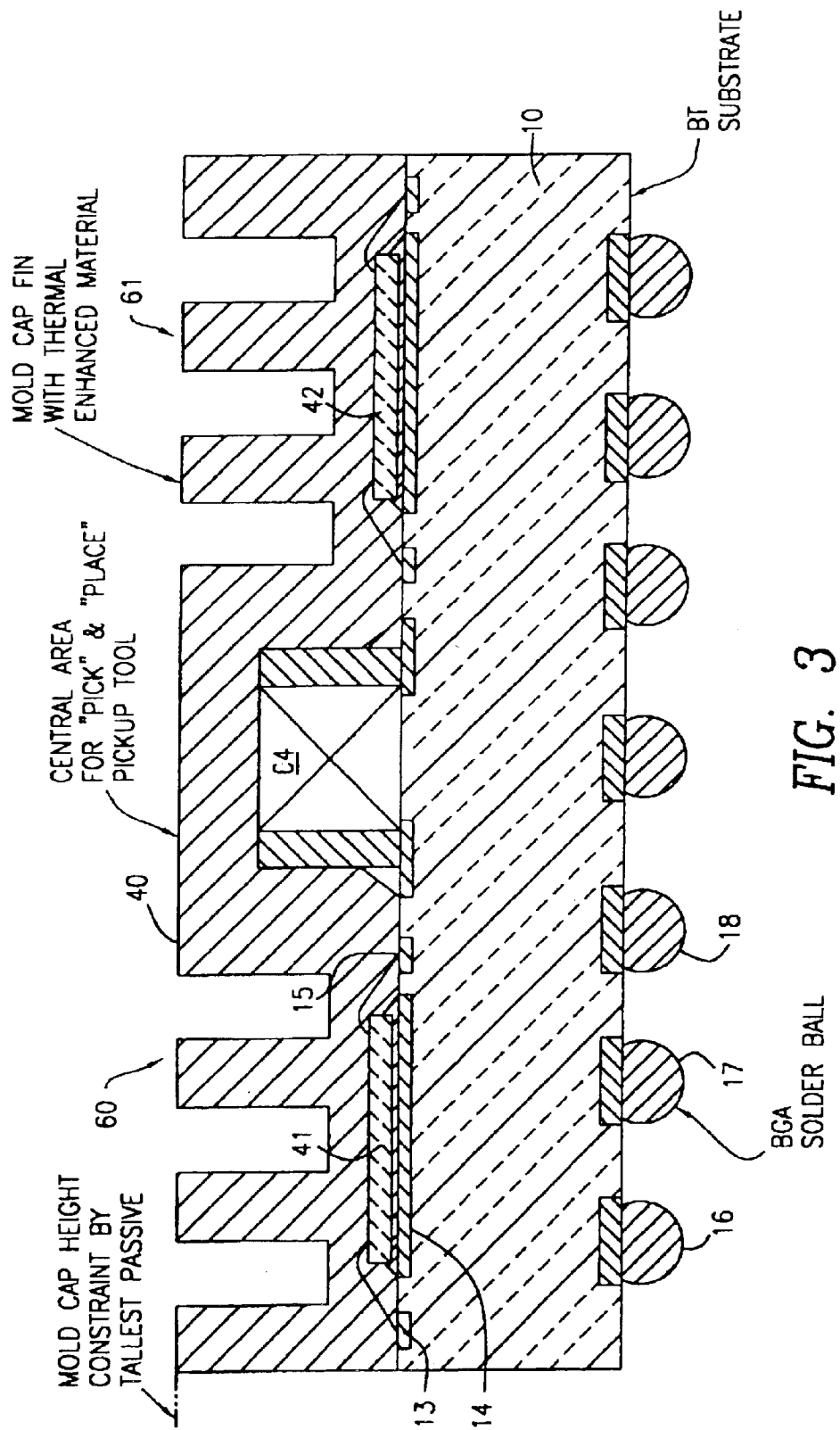
FIG. 3 is a cross-section of an MCM package in which the mold cap is finned to improve the thermal resistance $R_{th}$.

FIG. 3 shows a further embodiment of the invention in which the thermal resistance $R_{th}$ of the package is improved by forming fins 60 and 61 in the insulation cap 40. Note that tall passives, such as capacitor C4 are placed centrally between fin valleys and that the substrate surface above C4 does not contain fins (which would excessively increase the height of insulation cap 40). Note further that die 41 and 42 of FIG. 2 are spread apart in FIG. 3.

Figure 4:
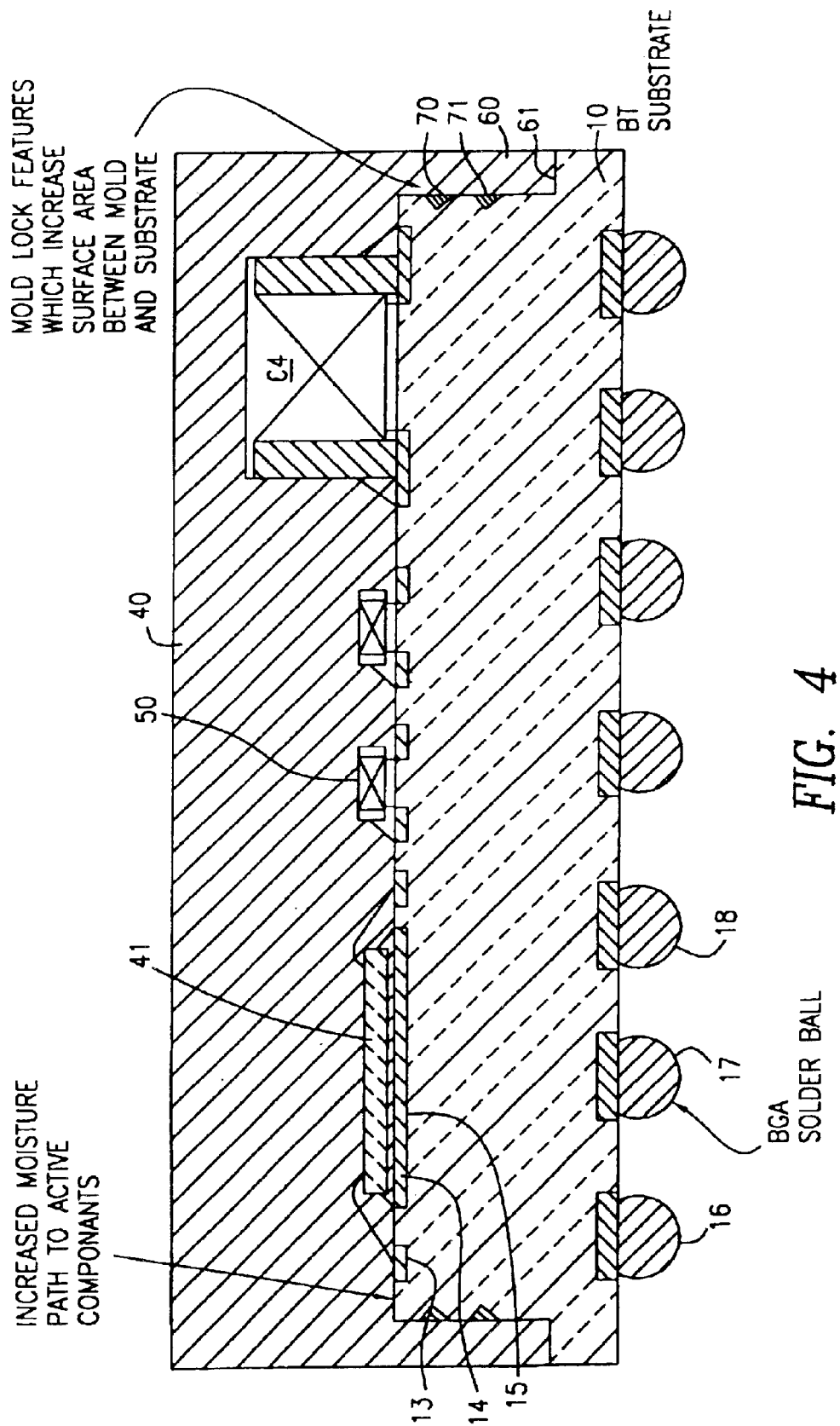
FIG. 4 is a cross-section of an MCM package in which the top cap telescopes over the substrate with a mold lock to improve moisture resistance of the package.

FIG. 4 shows a further embodiment of the invention in which the insulation mold cap 40 has a flange 60 which telescopes over the substrate 10. Suitable notches 70, 71 can be formed in the vertical surface of substrate 10. This novel structure produces a mold lock for top cap 40 to insulation substrate 10 and increases the length of the moisture path from the exterior of the package to the sealed components therein. Thus, the novel structure improves package reliability and manufactureability.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An MCM device comprising a flat thin insulation substrate having parallel top and bottom surfaces; a plurality of laterally displaced conductive vias extending between said top and bottom surfaces; a first flip chip semiconductor die having top and bottom surfaces and having at least electrodes on said top and bottom surfaces; said electrodes on said die bottom surface each connected to a respective via; a second flip chip semiconductor die having top and bottom surfaces and having at least electrodes on said top and bottom surfaces; said electrodes on said second die bottom surface each connected to a respective via, and a first and second moldable conductive electrodes extending over the top of said substrate and over the top surfaces of said die and in contact therewith, and further connected to a respective one of said vias wherein the first and second electrodes are insulated from one another by an insulation dam that is in contact with vertical side surfaces of the electrodes.

2. The device of claim 1, which further includes respective solder balls connected to the bottoms of said conductive vias.

* * * * *